(12) United States Patent
Ramadass

(10) Patent No.: US 11,543,453 B2
(45) Date of Patent: Jan. 3, 2023

(54) IN-WAFER RELIABILITY TESTING

(71) Applicant: Texas Instruments Incorporated, Dallas, TX (US)

(72) Inventor: Yogesh Kumar Ramadass, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 136 days.

(21) Appl. No.: 16/730,047

(22) Filed: Dec. 30, 2019

(65) Prior Publication Data

US 2020/0241071 A1 Jul. 30, 2020

Related U.S. Application Data

(60) Provisional application No. 62/796,627, filed on Jan. 25, 2019.

(51) Int. Cl.

| | |
|---|---|
| *G01R 31/3185* | (2006.01) |
| *G01R 31/28* | (2006.01) |
| *G01R 19/252* | (2006.01) |
| *G01R 19/145* | (2006.01) |
| *G01R 1/067* | (2006.01) |

(52) U.S. Cl.
CPC ...... *G01R 31/318511* (2013.01); *G01R 1/067* (2013.01); *G01R 19/145* (2013.01); *G01R 19/252* (2013.01); *G01R 31/2889* (2013.01)

(58) Field of Classification Search
CPC ........ H01L 21/00; H01L 2221/00; G01R 1/00
See application file for complete search history.

(56) References Cited

U.S. PATENT DOCUMENTS

| | | | |
|---|---|---|---|
| 6,339,338 B1 * | 1/2002 | Eldridge | G06F 1/26 324/754.03 |
| 8,487,444 B2 * | 7/2013 | Law | H01L 23/481 257/777 |
| 2013/0238273 A1 * | 9/2013 | Tercariol | H01L 29/7803 324/756.01 |
| 2014/0002127 A1 * | 1/2014 | Shao | G01R 31/26 324/762.01 |
| 2014/0029150 A1 * | 1/2014 | Fledell | G01R 1/36 361/93.9 |
| 2014/0264806 A1 * | 9/2014 | Arbuthnot | H01L 24/67 257/676 |

(Continued)

*Primary Examiner* — Jermele M Hollington
*Assistant Examiner* — Temilade S Rhodes-Vivour
(74) *Attorney, Agent, or Firm* — Valerie M. Davis; Frank D. Cimino

(57) ABSTRACT

An integrated circuit includes a semiconductor die having conductive pads and an electronic component with a first terminal coupled to a third conductive pad and a second terminal coupled to a fourth conductive pad. A resistor has a first terminal coupled to the fourth conductive pad and a second terminal coupled to the fifth conductive pad, and a first transistor has a first terminal coupled to the first conductive pad, a second terminal coupled to the fifth conductive pad, and a control terminal. A second transistor has a first terminal coupled to the first transistor, a second terminal coupled to the third conductive pad, and a control terminal. A pulse generator has an input coupled to the second conductive pad and an output coupled to the control terminal of the second transistor.

21 Claims, 9 Drawing Sheets

(56) References Cited

U.S. PATENT DOCUMENTS

| | | | |
|---|---|---|---|
| 2016/0061880 A1* | 3/2016 | Uppal | G01R 31/12 |
| | | | 324/762.01 |
| 2016/0172277 A1* | 6/2016 | Lee | H01L 23/3121 |
| | | | 257/676 |
| 2018/0019194 A1* | 1/2018 | Papillon | H01L 25/04 |

* cited by examiner

# US 11,543,453 B2

1

IN-WAFER RELIABILITY TESTING

REFERENCE TO RELATED APPLICATION

Under 35 U.S.C. § 119, this application claims priority to, and the benefit of, U.S. provisional patent application No. 62/796,627, entitled "CIRCUIT AND METHOD FOR IN-WAFER RELIABILITY TESTS", and filed on Jan. 25, 2019, the entirety of which is hereby incorporated by reference.

BACKGROUND

Laterally diffused metal oxide semiconductor (LDMOS) transistors and electrostatic discharge (ESD) clamping devices are often used in integrated circuits for power switching functions and/or ESD protection. The ESD protection afforded by such devices are often rated in terms of reverse recovery safe operating area (RRSOA), characterized using transmission line pulse (TLP) testing or very fast TLP testing (VFTLP). TLP testing uses expensive equipment that is cumbersome, time consuming and does not offer much flexibility. Moreover, conventional TLP testing for ESD clamps of an IC cannot economically characterize temperature effects on a transistor pulsed breakdown voltage (BV), and instrumentation limitations prevent practical testing of ESD clamp devices of multiple wafers across temperature.

SUMMARY

According to one aspect, an integrated circuit (IC) includes a semiconductor die having a first conductive pad, a second conductive pad, a third conductive pad, a fourth conductive pad, and a fifth conductive pad. The IC includes an electronic component in the semiconductor die. The electronic component has a first terminal coupled to the third conductive pad, and a second terminal coupled to the fourth conductive pad. A resistor has a first terminal coupled to the fourth conductive pad, and a second terminal coupled to the fifth conductive pad. A first transistor has a first terminal coupled to the first conductive pad, a second terminal coupled to the fifth conductive pad, and a control terminal; and a second transistor has a first terminal coupled to the first transistor, a second terminal coupled to the third conductive pad, and a control terminal. The IC further includes a pulse generator having an input coupled to the second conductive pad, and an output coupled to the control terminal of the second transistor.

In one example, the first transistor is a PMOS transistor having a source coupled to the first conductive pad, a drain coupled to the fifth conductive pad, and a gate; the second transistor is an NMOS transistor having a drain coupled to the gate of the first transistor, a source coupled to the third conductive pad, and a gate coupled to the output of the pulse generator. The IC in this example further includes a second resistor having a first terminal coupled to the drain of the second transistor and to the gate of the first transistor, and a second terminal coupled to the first conductive pad.

In one example, the IC further includes a sixth conductive pad, and a multiplexer. The multiplexer includes a first multiplexer input coupled to the fourth conductive pad, a second multiplexer input coupled to the third conductive pad, a first multiplexer output, a second multiplexer output, a third multiplexer output, a fourth multiplexer output, and a control input coupled to the sixth conductive pad. The IC in this example also includes a second electronic component in the semiconductor die, where the second electronic component has a first terminal coupled to the third multiplexer output, and a second terminal coupled to the fourth multiplexer output.

In one example, the IC further includes a third transistor having a first terminal coupled to the fifth conductive pad, a second terminal coupled to the third conductive pad, and a control terminal. In this example, the pulse generator has a second output coupled to the control terminal of the third transistor. In one implementation, the third transistor is an NMOS transistor having a drain coupled to the fifth conductive pad, a source coupled to the third conductive pad, and a gate coupled to the second output of the pulse generator.

In one example, the first transistor is an NMOS transistor having a drain coupled to the first conductive pad, a source, and a gate; and the second transistor is an NMOS transistor having a drain coupled to the fifth conductive pad, a source coupled to the third conductive pad, and a gate coupled to the output of the pulse generator. The IC in this example also includes a second resistor having a first terminal coupled to the source of the first transistor, and a second terminal coupled to the fifth conductive pad.

According to another aspect, a method includes engaging probe pins of a probe with respective conductive pads of a die location of a wafer, applying a signal from the probe to a pulse generator of the die location, measuring a voltage and a current of a device under test (DUT) of the die location using the probe, and determining an operating characteristic of the DUT according to a measured voltage and a measured current of the DUT using the probe. In one example, the determined operating characteristic is a breakdown voltage of a transistor DUT. The method in one implementation, the method further includes, using the probe, storing a value in a register of the die location according to the breakdown voltage of the transistor DUT. In another example, the determined operating characteristic is a safe operating area (SOA) of a transistor DUT.

In one example, the method further includes applying a select signal to a multiplexer of the die location to select a second DUT for testing using the probe; applying a second signal from the probe to the pulse generator of the die location using the probe; measuring a voltage and a current of a DUT using the probe; and determining an operating characteristic of the second DUT according to a measured voltage and a measured current of the DUT of the second die location using the probe.

In one example, the method further includes disengaging the probe pins of the probe from the respective conductive pads of the die location of the wafer; engaging the probe pins of the probe with respective conductive pads of a second die location of the wafer; applying a signal from the probe to a pulse generator of the second die location; measuring a voltage and a current of a second DUT of the second die location using the probe; and determining an operating characteristic of the second DUT according to a measured voltage and a measured current of the second DUT using the probe.

According to a further aspect, a wafer probe includes probe pins arranged to engage respective conductive pads of a die location of a wafer, a power supply having an output coupled to a first probe pin, and a reference terminal coupled to a third probe pin, as well as a logic circuit having an output coupled to a second probe pin, and an analog-to-digital converter having a first input coupled to a fourth probe pin, and a second input coupled to a fifth probe pin. In one example, the wafer probe includes a sixth probe pin coupled to a second output of the logic circuit to engage a respective conductive pad of the die location of the wafer. In another example, the wafer probe includes a seventh probe pin coupled to a third output of the logic circuit.

DETAILED DESCRIPTION

Figure 1:
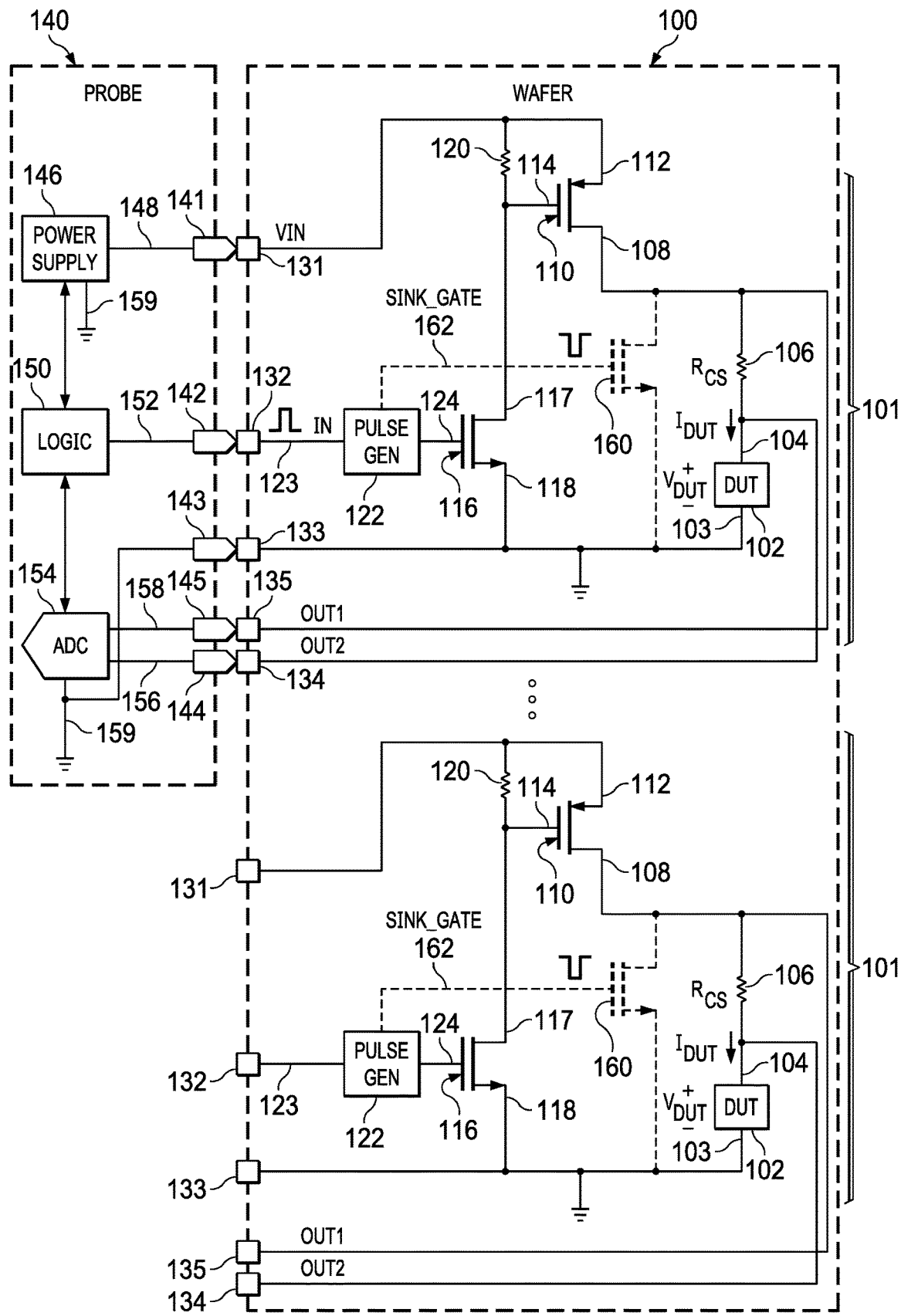
FIG. 1 is a schematic diagram of a wafer probe engaging a first die location of a wafer to test a transistor device using an on-die test circuit.

In the drawings, like reference numerals refer to like elements throughout, and the various features are not necessarily drawn to scale. Also, the term "couple" or "couples" includes indirect or direct electrical or mechanical connection or combinations thereof. For example, if a first device is couple to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a wafer probe testing system to test one or more electronic components of a semiconductor wafer 100 prior to die singulation or separation in a semiconductor device fabrication process. The wafer 100 includes multiple die locations 101 that are subsequently separated from the wafer 100 and from one another, followed by packaging to form individual integrated circuit products. As the die locations 101 are to be subsequently separated from one another, these can also be referred to as dies of the unitary wafer 100 prior to die singulation. The wafer 100 includes a semiconductor structure, such as a silicon wafer, a silicon-on-insulator (SOI) wafer, etc., as well as an electronic component 102 each of two or more die locations 101 in the semiconductor wafer 100. The individual die locations 101 in this example include on-die test circuitry to interface a tested electronic component during wafer probe testing. As used herein, the electronic component 102 is a device hundred test (DUT). The electronic component or DUT 102 in one example is a transistor or a diode or other ESD clamp component, although not a requirement of all possible implementations.

The electronic component 102 has a first terminal 103 and a second terminal 104. The on-die test circuitry in this example includes a current sense resistor 106 (Rcs) connected in a series configuration to sense a current $I_{DUT}$ of the electronic component 102. The resistor 106 has a first terminal coupled to the second terminal 104 of the electronic component 102, and a second terminal 108. The die location 101 includes conductive pads interconnected with the terminals 103 and 104 to measure a voltage $V_{DUT}$ of the electronic component 102, and conductive pads connected with the terminals of the current sense resistor 106 to sense a voltage across the resistor 106 in order to measure the current $I_{DUT}$ of the electronic component 102 during wafer probe testing.

The on-die test circuitry of the individual die locations 101 in FIG. 1 also includes a first transistor 110 with a first terminal 112, a second terminal the second terminal 108 of the current sense resistor 106, and a control terminal 114. In addition, the test circuitry includes a second transistor 116 with a first terminal 117 coupled to the control terminal 114 of the first transistor 110, a second terminal 118 coupled to the second terminal 103 of the electronic component 102, and a control terminal. A second resistor 120 in the test circuitry includes a first terminal coupled to the first terminal 117 of the second transistor 116 and to the control terminal 114 of the first transistor 110, as well as a second terminal coupled to the first terminal 112 of the first transistor 110. The on-die test circuitry in FIG. 1 further includes a pulse generator 122 with an input 123 and an output 124 coupled to the control terminal of the second transistor 116.

The individual die locations 101 of the wafer 100 include conductive pads, such as copper, aluminum or other conductive features exposed along a top side of the wafer 100 in the individual die locations 101, with electrical connections through a metallization structure of the wafer 100 to the on-die test circuitry. The conductive pads are configured for engagement by conductive probe pins of a wafer test probe described below to implement wafer probe testing of the electronic components 102 of the individual die locations 101. With respective conductive pads of a die location of a wafer.

The example of FIG. 1 has conductive pads 131-135 in each individual die location 101 of the wafer 100, including a first conductive pad 131, a second conductive pad 132, a third conductive pad 133, a fourth conductive pad 134, and a fifth conductive pad 135. The first conductive pad 131 is coupled to the first terminal 112 of the first transistor 110 to deliver an input voltage signal VIN from an engaged probe to the second terminal of the resistor 120 and to the first terminal 112 of the first transistor 110. The second conductive pad 132 is coupled to the input 123 of the pulse generator 122. The third conductive pad 133 is coupled to the first terminal 103 of the electronic component 102 and to the second terminal 118 of the second transistor 116 to provide a ground or other reference voltage connection to an engaged wafer probe. The fourth and fifth conductive probes 134 and 135 provide voltage sensing across the terminals of the resistor 106 to sense the current $I_{DUT}$ of the electronic component 102 during probe testing. The fourth conductive pad 134 is coupled to the second terminal 104 of the electronic component 102 and the first terminal of the resistor 106 to deliver an output signal voltage OUT2 to an engaged wafer probe. The fifth conductive pad 135 is coupled to the second terminal 108 of the resistor 106 and to the second terminal of the first transistor 110 to deliver an output signal voltage OUT1 to an engaged wafer probe.

The on-die test circuitry in FIG. 1 provides a controlled current source to perform controlled pulse testing of the electronic component 102 under control of an engaged wafer probe 140. In one example, the test circuitry implements transmission line pulsing (TLP), such as very fast transmission line pulsing (VFTLP) to test and ESD clamping device or other electronic component 102 of an engaged die location 101 of the wafer 100. In the example of FIG. 1, the first transistor 110 is a PMOS transistor with a source 112 coupled to the first conductive pad 131, a drain coupled to the fifth conductive pad 135, and a gate control terminal 114 coupled to the first terminal 117 of the second transistor 116 and to the first terminal of the second resistor 120. In this example, the test circuitry uses a saturated PMOS device 110 as a current source during pulses under control of the second transistor 116. The second transistor 116 in this example is an NMOS transistor with a drain 117 coupled to the gate of the first transistor 110 into the first terminal of the second resistor 120, as well as a source 118 coupled to the third conductive pad 133, and a gate control terminal coupled to the output 124 of the pulse generator 122.

In operation, the input 123 of the pulse generator 122 receives an input signal IN from an engaged probe, and the pulse generator output 124 respond by generating a high-going pulse signal of a predetermined duration or pulse width, such as on the order of nano seconds. The high going pulse at the output 124 of the pulse generator 122 turns the NMOS second transistor 116 on. In response to the turn on of the second transistor 116, current flows through the second resistor 120. The current flow through the resistor 120 creates a non-zero source-gate voltage between the terminals 112 and 114 of the PMOS first transistor 110. In response to the source-gate voltage reaching and exceeding a threshold voltage of the first transistor 110, the first transistor 110 conducts current from an input source connected to the first conductive pad 131 (VIN) to allow current $I_{DUT}$ to flow from the first conductive pad 131 through the current sense resistor 106 and through the electronic component 102. The current flow creates a proportional voltage across the current sense resistor 106.

The wafer probe 140 is shown in FIG. 1 engaged with a first die location 101 of the wafer 100. The wafer probe 140 includes probe pins 141-145 arranged to engage the respective conductive pads 131-135 of a die location 101 of a wafer 100. In one example, the wafer probe pins include a first probe pin 141, a second probe pin 142, a third probe pin 143, a fourth probe pin 144, and a fifth probe pin 145. The wafer probe 140 in this example includes a power supply 146 with an output 148 coupled to the first probe pin 141. A reference terminal 159 forms the ground reference of the power supply and other circuits of the wafer probe 140. The reference terminal 159 is coupled to the third probe pin 143. In addition, the wafer probe 140 includes a logic circuit 150 with an output 152 coupled to the second probe pin 142 to provide the input signal IN to the input 123 of the pulse generator 122. The logic circuit 150 has a control output coupled to the power supply 146 to control an amplitude of the input voltage signal VIN applied to the first conductive terminal 131 of the wafer die location 101.

The wafer probe 140 further includes an analog-to-digital (A/D) converter 154 with a first input 156 coupled to the fourth probe pin 144, and a second input 158 coupled to the fifth probe pin 145. The pulse generator circuit 122 in this example operates in response to the input signal IN to provide a pulse to the gate control terminal of the second transistor 116 and to control the width of the resulting current pulse provided to the electronic component 102. The amplitude of the input voltage signal VIN from an engaged probe, the sizing of the first transistor (e.g., channel width, doping, etc.) of the first transistor 110 and the sizing of the second resistor 120 set the magnitude of the electronic component pulse current $I_{DUT}$ and the electronic component voltage $V_{DUT}$ during probe testing.

In one example, the logic circuit 150 controls operation of the A/D converter 154. The A/D converter 154 in one example converts a voltage between the input 156 and 158 and provides a corresponding digital value to the logic circuit 150 that represents the voltage across the current sense resistor 106, and hence the current $I_{DUT}$ flowing in the electronic component 102. In one example, the A/D converter 154 also converts the voltage at the first input 156 with respect to the reference node 159 and provides a corresponding digital value to the logic circuit 150 that represents the voltage $V_{DUT}$ across the electronic component 102. In one example, the logic circuit 150 provides the input signal IN to the input 123 of the pulse generator 122 and also provides a signal to the A/D converter 154 to control the relative timing of the applied pulse and the conversions of the measured device current $I_{DUT}$ and measured device voltage $V_{DUT}$. In one example, the logic circuit 150 controls the A/D converter 154 to convert multiple $V_{DUT}$ voltage and $I_{DUT}$ current measurements at different times for a given applied current pulse, and determines safe operating area according to waveform analysis of multiple points of a given current pulse and voltage pulse of the tested electronic component 102.

In one example, the logic circuit 150 provides a single input signal IN to begin TLP or VFTLP testing of the electronic component 102, and the pulse generator 122 provides a series of successive pulses to the gate control terminal of the second transistor 116 during the time that the input signal IN is high, where the pulse generator 122 generates individual pulses of a predetermined pulse width (e.g., 1-500 ns), and a predetermined duration between pulses while the input signal IN remains high.

In another example, the logic circuit 150 provides the input signal IN as a pulse with a given pulse width, and the pulse generator 122 generates a corresponding pulse signal at the output 124 of the same pulse width, and the logic circuit 150 controls the number, with an spacing of pulses of the input signal IN to control the current pulse is applied to the electronic component 102.

The logic circuit 150 controls the conversion of current and voltage measurements by the A/D converter 154 and determines whether the tested electronic component 102 has passed or failed a given TLP or VFTLP test criterion. In one example, the logic circuit 150 of the wafer probe 140 provides the inverted measured values to an external test circuit (not shown) operatively coupled with the wafer probe 144 analysis according to one or more test criterion. In another example, the logic circuit 150 of the wafer probe 140 performs one or more computations or otherwise evaluates the measured current and voltage values associated with one or more test pulses, and determines whether a given tested electronic component 102 passes or fails one or more test criterion, and reports the test results to an external circuit or system (not shown).

In one implementation, the logic circuit 150 and/or a supervisory host test circuit (not shown) performs TLP and/or VFTLP testing of the electronic component 102 using the on-die test circuitry as described above, and determines a pass or fail condition of the tested electronic component 102 of a given engaged wafer die location 101. In one implementation, the probe 140 (e.g., the logic circuit 150)

determines an operating characteristic of the tested electronic component 102 according to the measured voltage and a current of the electronic component 102. In one example, the logic circuit 150 determines a safe operating area (SOA) of the tested electronic component 102, and stores the determined SOA value and/or provides the SOA value to the supervisory host test circuit. In another example (e.g., FIGS. 7 and 8 below), the wafer probe 140 determines a breakdown voltage of a tested electronic component, and stores this and/or provides the breakdown voltage value to the supervisory host test circuit. In one example, the wafer probe 140 in FIG. 1 characterizes or otherwise determines a reverse recovery SOA (RRSOA) of the electronic component 102, for example, by the transmission line pulsing (TLP) technique, including measuring and/or computing the energy delivered to the electronic component 102 from the voltage and current measurements, the pulse widths of the applied pulses, the pulse switching speed and slew-rate of the TLP pulses, reactive current through body diode of the tested electronic component 102 and superimposition of DC current with the TLP pulses. In another example, the wafer probe 140 operates in combination with on-die test circuitry (not shown) to measure other electrical operating parameters of the electronic component 102, and characterizes or determines other operating characteristics of the tested electronic component 102, such as leakage currents characterized according to measured currents (e.g., the voltage across the current sense resistor 106) after the test pulse, as well as other parameters such as gate leakage, drain leakage, etc.

Where the engaged wafer die location 101 includes a single device under test, the logic circuit 150 and/or the supervisory host test circuit then disengages the probe pins 141-145 of the probe 140 from the respective conductive pads 131-135 of the die location 101 of the wafer 100, translates the wafer probe 142 a different wafer location 101 of the wafer, and engages the probe pins 141-145 of the probe 140 with respective conductive pads 131-135 of a second die location 101 of the wafer 100. At the second die location 101, the probe 140 applies the input signal IN, measures a voltage and current of a second electronic component under test 102 at the second die location 101, and determines an operating characteristic of the second tested electronic component 102 according to the measured voltage and a current of the second DUT 102. In another example, the individual wafer die locations 101 include multiple electronic components to be tested, and the on-die test circuitry includes a multiplexer to allow the wafer probe 142 test multiple DUTs at a given engaged die location 101 before moving to the next die location 101, as illustrated below in connection with FIGS. 2 and 6.

In one example the on-die test circuitry of the individual wafer die locations 101 includes a third transistor 160. The third transistor 160 includes a first terminal coupled to the fifth conductive pad 135, a second terminal coupled to the third conductive pad 133, and a control terminal coupled to a second output 162 of the pulse generator 122, as shown in dashed line in FIG. 1. In the example of FIG. 1, the third transistor 160 is an NMOS transistor with a drain coupled to the fifth conductive pad 135, a source coupled to the third conductive pad 133, and a gate coupled to the second output 162 of the pulse generator 122. As illustrated and described below in connection with FIGS. 4 and 5, the pulse generator 122 in one example generates a pulse signal (SINK_GATE) at the second output 162 to control the gate of the third transistor 160 in a predetermined temporal relationship to the main pulse signal generated at the first output 124 of the pulse generator 122.

The third transistor 160 in one example is operated according to the second output signal from the pulse generator 122 in order to reduce or avoid the effects of parasitics in the test circuitry and/or the main circuitry of the tested die location 101. For example, where a large test pulse current at a relatively short test pulse width are desired for testing the electronic component 102, parasitic capacitances of the first transistor (e.g., drain-source capacitance) may make fast switching of large currents and practical. In one example, the third transistor 160 is turned on concurrently with, or nearly concurrently with the first transistor 110 in order to allow the current flow through the first transistor 110 to build up while no current flows through the tested electronic component 102. The pulse generator 122 in this example provides a low going pulse to the gate of the third transistor 160 while the first transistor 110 remains on after steady-state current flow has been established. The low going pulse at the gate of the third transistor 160 turns the third transistor 160 off, and quickly redirects the current flow through the tested electronic component 102 and the current sense resistor 106. In this manner, any desired test pulse current level can be used in combination with any desired test switching speed and/or pulse width, largely independent of parasitic capacitances in the on-die test circuitry.

Figure 2:
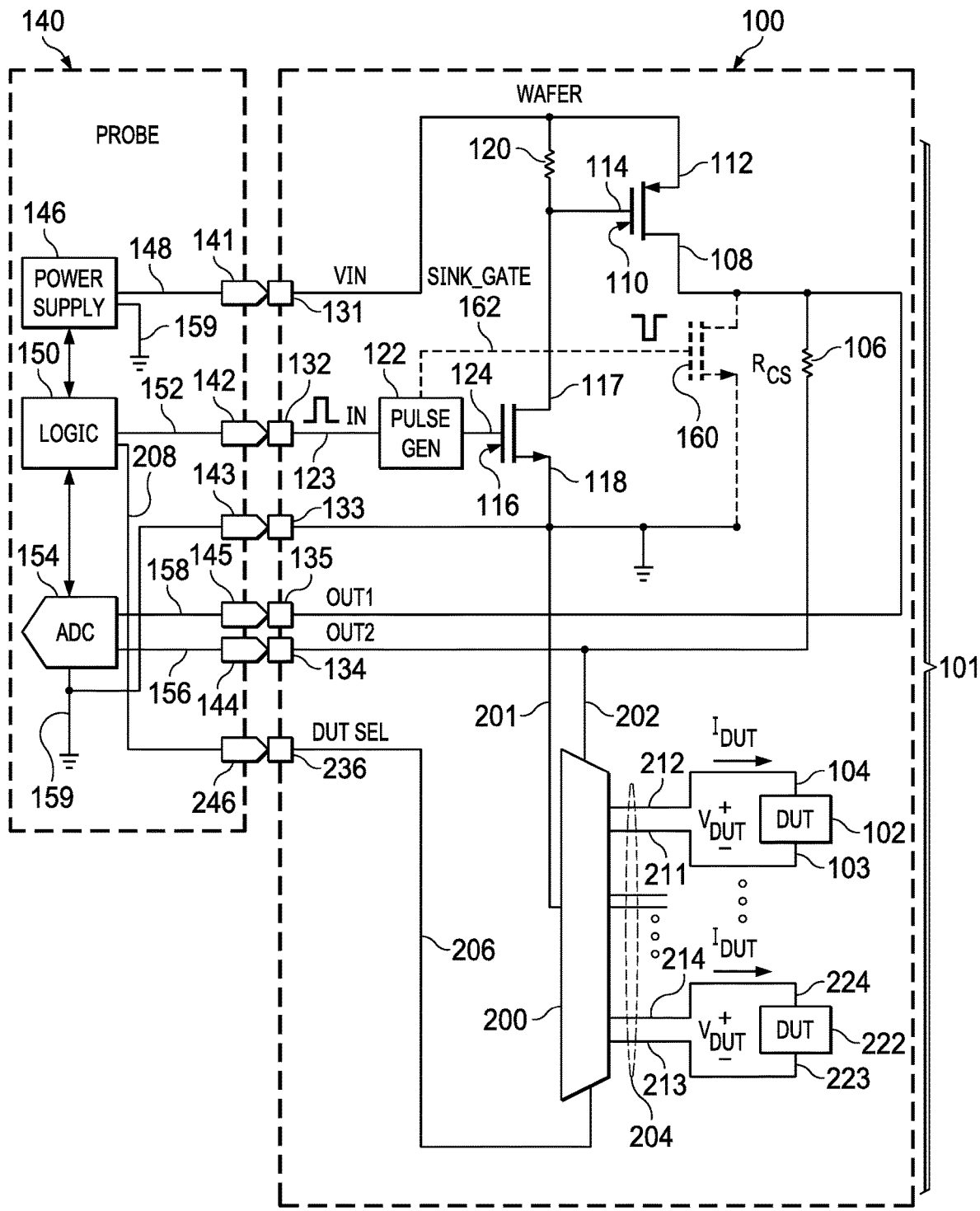
FIG. 2 is a schematic diagram of a wafer probe engaging a first die location of another wafer to test multiple transistor devices using an on-die test circuit.

FIG. 2 shows another wafer probe test implementation, in which the wafer probe 140 is engaged with the die location 101 to test multiple transistor devices using an on-die test circuit. The wafer probe 140 in this example operates as described above in connection with FIG. 1. The die location 101 in FIG. 2 includes the transistors 110 and 116 and pulse generator 122 as described above, and may include the third transistor 160, although not required of all possible implementations.

The on-die test circuitry in FIG. 2 also includes a multiplexer 200 that selectively interconnects a selected one of multiple electronic components 102 with the on-die test circuitry. The multiplexer 200 includes a first multiplexer input 201 coupled to the fourth conductive pad 134, and a second multiplexer input 202 coupled to the third conductive pad 133. The multiplexer 200 also includes outputs 204 and a control input 206 configured to receive a single or multi bit control signal DUT SEL from a second output 208 of the logic circuit 150 of an engaged wafer probe 140. The multiplexer outputs 204 include a first multiplexer output 211 coupled to the first terminal 103 of the electronic component 102, a second multiplexer output 212 coupled to the second terminal 104 of the electronic component 102, a third multiplexer output 213, and a fourth multiplexer output 214. The wafer die location 101 in FIG. 2 includes multiple electronic components to be tested, including a second electronic component 222 (labeled DUT) that has a first terminal 223 coupled to the third multiplexer output 213, and a second terminal 224 coupled to the fourth multiplexer output 214.

The wafer die location 101 in this example includes a sixth conductive pad 236 coupled to the control input 206 of the multiplexer 200. The wafer probe 140 includes a sixth probe pin 246 configured to engage the sixth conductive pad 236 when the wafer probe 140 is engaged with the wafer die location 101 as shown in FIG. 2. The control input 206 in one example is a single line to convey a single bit control signal DUT SEL to select a pair of multiplexer outputs for connection of a selected one of the electronic components 102, 222 to the multiplexer inputs 201 and 202.

In another example, a multi-bit control input 206 is provided, and the wafer die location 101 includes one or more additional conductive pads (not shown) configured to interface with one or more additional wafer probe pins (not shown) of the wafer probe 140. In operation, the logic circuit 150 applies the select signal DUT SEL to the control input 206 of the multiplexer 200 of the die location 101 to initially select the first electronic component DUT 102 for testing as described above. In this circuit condition, the multiplexer 200 couples the first multiplexer input 201 to the first multiplexer output 211 and couples the second multiplexer input 202 to the second multiplexer output 212. This multiplexer condition couples the first terminal 103 of the selected electronic component 102 to the third conductive pad 133 and couples the second terminal 104 of the electronic component 102 to the fourth conductive pad 134. The testing of the first electronic component 102 in one example includes applying the input signal IN to the pulse generator 122, measuring voltage and current of the selected electronic component 102 using the A/D converter 154, and determining an operating characteristic of the electronic component 102 according to the measured voltage and current.

The logic circuit 150 then changes the select signal DUT SEL to select the second electronic component DUT 222 for testing. In this circuit condition, the multiplexer 200 couples the first multiplexer input 201 to the third multiplexer output 213, and couples the second multiplexer input 202 to the fourth multiplexer output 214. In this condition, the multiplexer 200 couples the first terminal 223 of the selected electronic component 222 to the third conductive pad 133 and couples the second terminal 224 of the electronic component 222 to the fourth conductive pad 134. The logic circuit 150 of the wafer probe 140 applies a second input signal IN from the probe 140 to the pulse generator 122 of the die location 101, and the logic circuit uses the A/D converter 154 to measure the voltage and a current of the selected electronic component 222, and the logic circuit 150 determines an operating characteristic of the electronic component 222 according to measured voltage and a current. This operation can be repeated for any integer number of electronic components of the engaged wafer die location 101 to be tested. Thereafter, as described above in connection with FIG. 1, the wafer probe 140 is disengaged from the first wafer die location 101 and translated to another die location 101 of the wafer 100.

Figure 3:
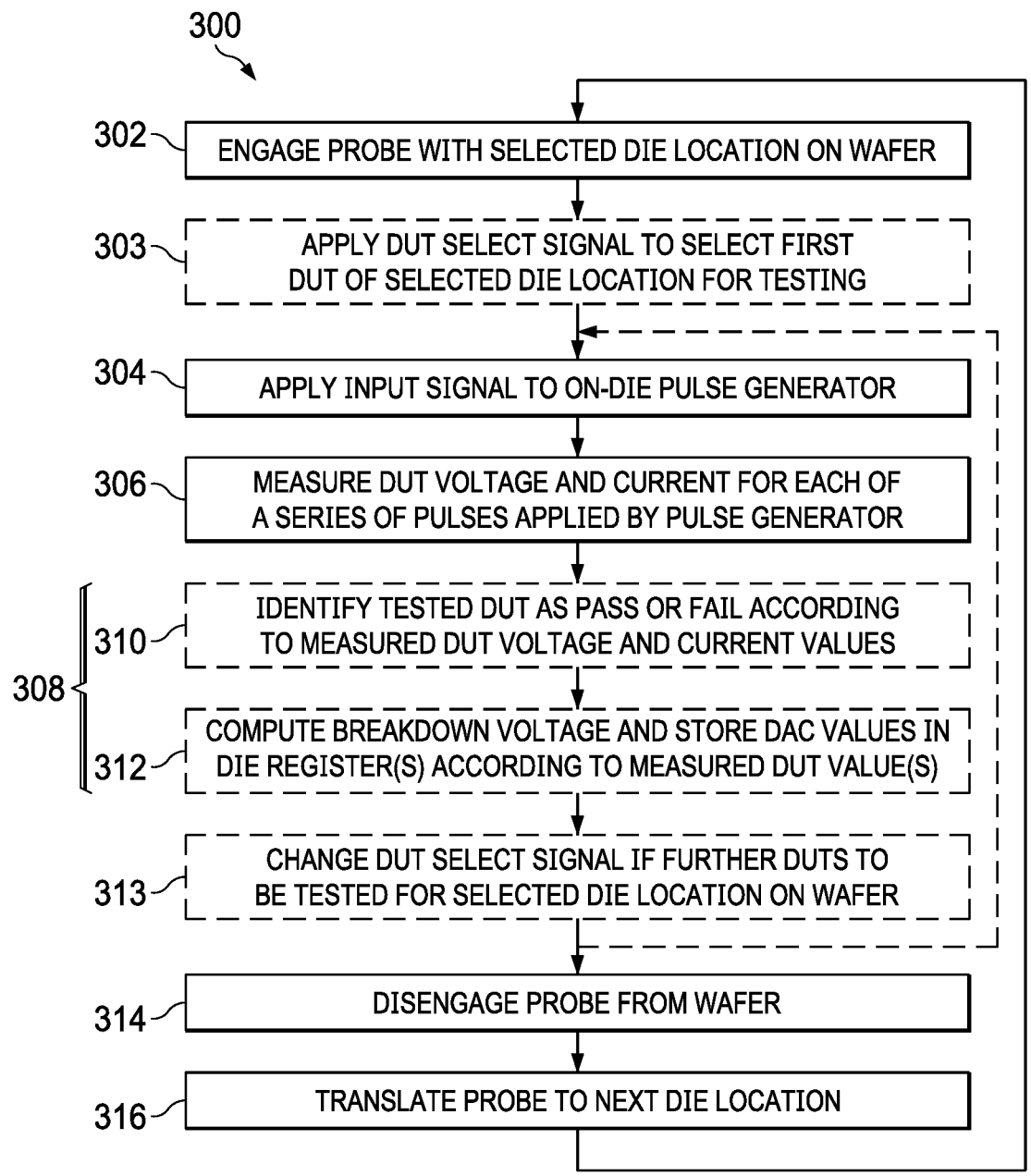
FIG. 3 is a flow diagram of a wafer probe test method.

FIG. 3 shows a wafer probe test method 300. The method 300 as described below in connection with the on-die test circuitry of the example wafer die locations 101 and the example wafer probe 140 described above, although the method 300 can be used in connection with other wafer probe systems and circuitry. The method 300 includes engaging probe pins (e.g., probe pins 141-145 in FIGS. 1 and 2) of a probe at 302 with respective conductive pads of a die location of a wafer (e.g., conductive pads 131-135 of wafer die location 101). In one example, the method 300 also includes the probe 140 applying a DUT select signal (e.g., DUT SEL) at 303 to a multiplexer of the die location 101 to select a first electronic component (DUT) of the engaged wafer die location 101 for testing (e.g., multiplexer 200 in FIG. 2). At 304, the method further includes applying a signal IN from the probe 140 to the on-die pulse generator 122 of the engaged die location 101. In one example, a single pulse signal is applied to the pulse generator 122 in order to initiate application of a controlled number of one or more current pulses to the tested electronic component 102. In another implementation, the input signal applied at 304 includes multiple pulses applied to the input 123 of the pulse generator 122 to initiate application of a corresponding number of current pulses to the tested electronic component 102. The method 300 also includes the probe 140 measuring a voltage and a current of the DUT 102 at 306.

The method 300 further includes determining an operating characteristic of the DUT 102 at 308 according to the measured voltage and a current of the DUT 102. In one example, the determination at 308 includes determining a safe operating area of a transistor electronic component. In the example of FIG. 3, the determination at 308 includes identifying the tested DUT as pass or fail according to the measured DUT voltage and current values. In one implementation, the determination at 308 includes determining a breakdown voltage of a transistor electronic component and storing a value in a register of the die location according to the breakdown voltage of the transistor at 312 in FIG. 3. In a further example, the determination at 308 includes determining a leakage current of an electronic component.

In one example, the method 300 further includes changing the DUT select signal (e.g., DUT SEL) at 313 applied to the multiplexer of the die location 101 to select a second electronic component (DUT) of the engaged wafer die location 101 for testing (e.g., multiplexer 200 in FIG. 2 switched to couple the on-die test circuitry to the second DUT 212), and repeating one or more of the steps at 304-308 as previously described. The method 300 continues at 314 with disengaging the probe pins from the respective conductive pads of the current die location, translating the wafer probe to a next die location of the wafer at 316, and engaging the probe pins of the wafer probe with the next selected die location at 302. The method 300 then repeats for testing one or more DUTs at the new die location as previously described at 303-313 above. Once all desired die locations of the wafer have been protested, the wafer probe is disengaged from the wafer, and the wafer is removed from a test fixture.

Figure 4:
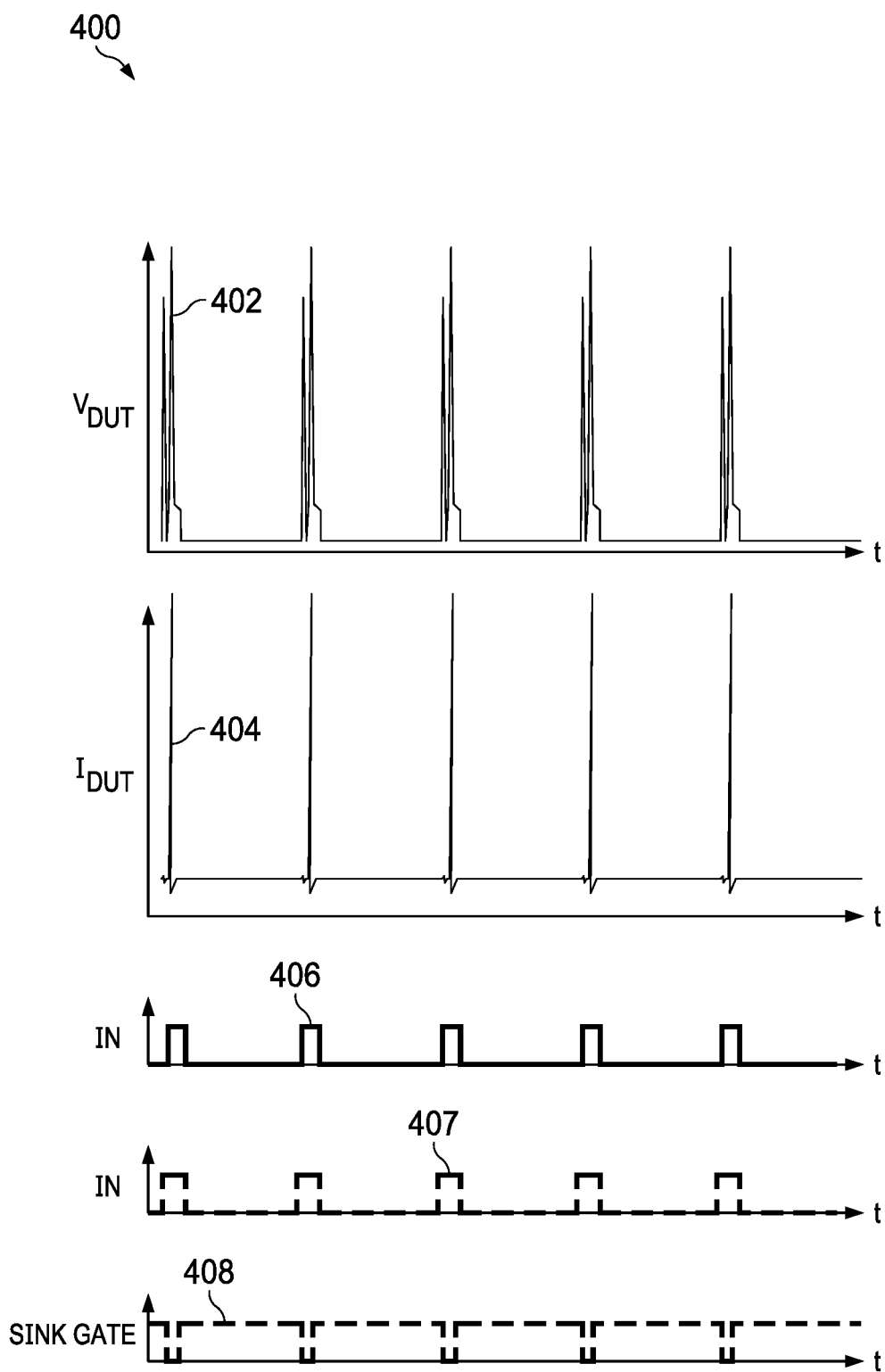
FIG. 4 is a signal diagram of tested device voltage and current curves, as well as example control signals provided to the on-die test circuit.
Figure 5:
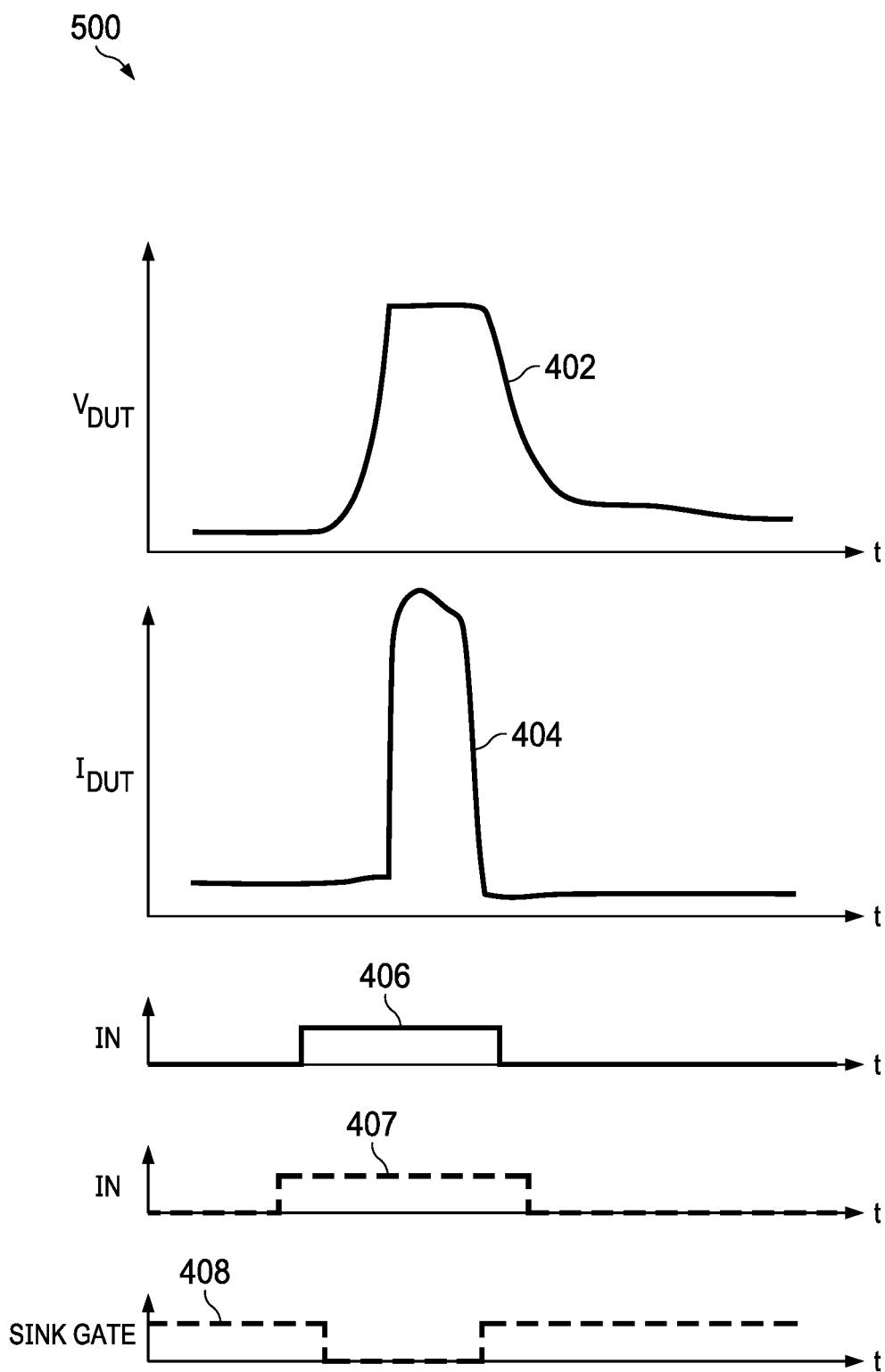
FIG. 5 is a signal diagram showing further details of the tested device voltage and current curves, and control signals provided to the on-die test circuit.

FIGS. 4 and 5 show signal diagrams of example control signals provided to the on-die test circuit and tested device voltage and current curves for an example TLP test implementation using the wafer probe 140 and the on-die test circuitry described above in connection with FIGS. 1 and 2. FIG. 4 includes a graph 400 with a tested device voltage curve 402 ($V_{DUT}$), a tested device current curve 404 ($I_{DUT}$), and a first input signal waveform 406 (IN signal in FIGS. 1 and 2). The graph 400 also includes an alternate set of control signal curves 407 and 408 (IN and SINK_GATE) shown in dashed line for an example implementation using the third transistor 160 in FIGS. 1 and 2. FIG. 5 shows a graph 500 with further details of portions of the curves 402, 404, and 406-408 over a shorter time interval than in FIG. 4. For an implementation that does not use the parasitic control third transistor 160, the pulse generator 122 in the TLP test example of FIGS. 4 and 5 generates the gate control signal to turn the first transistor 110 on in response to the input signal IN (curve 406). In one example, the pulse generator 122 provides the control signal to the gate of the second transistor 116 to selectively turn on the first transistor 110 for a predetermined time interval such that the resulting voltage pulse (curve 402) applied to the electronic component 102 has a pulse width on the order of single digit nanoseconds to hundreds of nano seconds. The curve 404 illustrates example current pulses showing the current flow through the electronic component 102 resulting from the applied voltage pulse of curve 402. In one implementation, the logic circuit 150 obtains multiple voltage and current readings from the A/D converter 154 and constructs a current versus voltage curve to characterize the safe operating area of a tested transistor electronic component 102.

In an alternate implementation that includes the third transistor 160 to accommodate parasitic effects in the on-die test circuitry, the dashed-line curves 407 and 408 in FIGS. 4 and 5 show example operation in which the input signal (curve 407) causes the pulse generator 122 to generate a corresponding pulse at the gate control terminal of the second transistor 116, which begins (e.g., goes high) while the pulse generator 122 holds the control signal SINK_GATE (curve 408) at the output 162 high (e.g., third transistor 160 on). Thereafter, the pulse generator 122 lowers the SINK_GATE signal (curve 408) to turn the third transistor 160 off while keeping the first transistor 110 on, to quickly redirect current flow from the third transistor 162 instead flow through the current sense resistor 106 and the tested electronic component 102.

Figure 6:
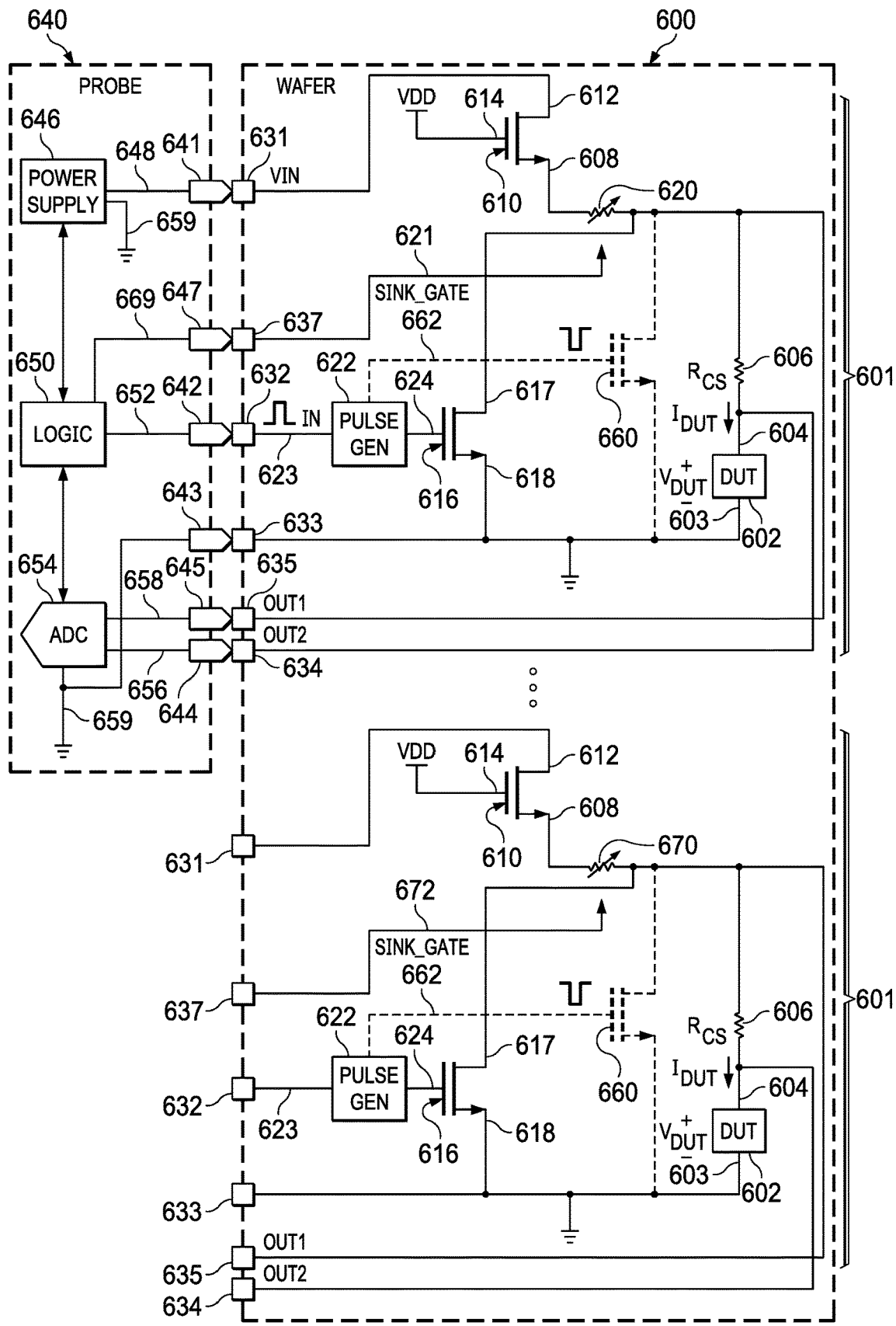
FIG. 6 is a schematic diagram of a wafer probe engaging a first die location of another wafer with another embodiment of an on-die test circuit.

FIG. 6 shows another example wafer probe test system with a wafer 600 that includes multiple wafer die locations 601 and another example on-die test circuit in the individual die locations 601. The individual wafer die locations 601 in this example each include one or more electronic components 602, such as transistors, clamping components, etc. The individual electronic components 602 each include a first terminal 603 and a second terminal 604. The on-die test circuitry of the individual die locations 601 in FIG. 6 includes devices, components, terminals, structures, nodes, features, regions, dimensions, and/or materials 602, 603, 604, 606, 608, 616, 617, 618, 622, 623, 624, 631, 632, 633, 634, and 635 that generally correspond to the respective devices, components, terminals, structures, nodes, features, dimensions, and/or materials 102, 103, 104, 106, 108, 116, 117, 118, 122, 123, 124, 131, 132, 133, 134, and 135 of the on-die test circuitry of FIGS. 1 and 2 described above. In addition, the wafer probe 640 in FIG. 6 includes devices, components, terminals, structures, nodes, features, regions, dimensions, and/or materials 640, 641, 642, 643, 644, 645, 646, 648, 650, 652, 654, 656, 658, and 659 that generally correspond to the respective devices, components, terminals, structures, nodes, features, dimensions, and/or materials 140, 141, 142, 143, 144, 145, 146, 148, 150, 152, 154, 156, 158, and 159 of the wafer probe 140 of FIGS. 1 and 2 described above.

The on-die test circuitry example of FIG. 6 includes a first transistor 610 that operates as a current source in series with a second resistor 620 between the first conductive pad 631 and the fifth conductive pad 635. The first transistor 610 in one example is an NMOS transistor that includes a first terminal 612 (e.g., a drain) coupled to the first conductive pad 631 to receive the input voltage signal VIN from an engaged wafer probe 640, a source coupled to a first terminal of the second resistor 620, and a gate control terminal 614 coupled to a supply voltage signal VDD. In the example of FIG. 6, the second transistor 616 is an NMOS transistor with a drain 617 coupled to the fifth conductive pad 635 and to the second terminal of the resistor 620. The second transistor 616 also includes a source terminal 618 coupled to the third conductive pad 633, and a gate control terminal coupled to the output 624 of the pulse generator 622. The resistance value of the second resistor 620 controls the current supplied to the tested electronic component 602, and the resistance in one example is controlled by the logic circuit via a logic circuit output 669 coupled to a control terminal 621 of an adjustable example of the resistor 620. In one example, the resistor 620 is tunable by a control signal from the logic circuit 650, provided to the adjustable resistor 620 via a control line 621 from an output 669 of the logic circuit 650 to control the tested device current $I_{DUT}$. In one implementation, the resistor 620 includes multiple resistors (not shown) coupled in a series and/or parallel configuration along with associated switches (not shown) operated according to a control signal on the control terminal 621 a resistance of the resistor 620. The second resistor 620 has a first terminal coupled to the source of the first transistor 610, and a second terminal coupled to the fifth conductive pad 635.

The on-die control circuitry of the individual wafer location 601 in FIG. 6 operates in similar fashion to the circuitry of FIGS. 1 and/or 2, including optional inclusion and operation of the third transistor 660 according to a control SINK GATE from a second output 662 of the pulse generator 622. In this example, the second transistor 610 is turned on in response to engagement of the wafer probe 640 with the selected die location 601, and the pulse generator 622 selectively turns the second transistor 616 off to redirect current from the first transistor 610 into the tested electronic component 602 for pulse testing using TLP, VFTLP or other pulse testing techniques. In another possible implementation, the individual die locations 601 further include a multiplexer (not shown) interconnected and operable according a DUT select signal from the logic circuit 650 in order to successively test different electronic components of the engaged die location 601 according to the concepts described above in connection with FIG. 2.

Figure 7:
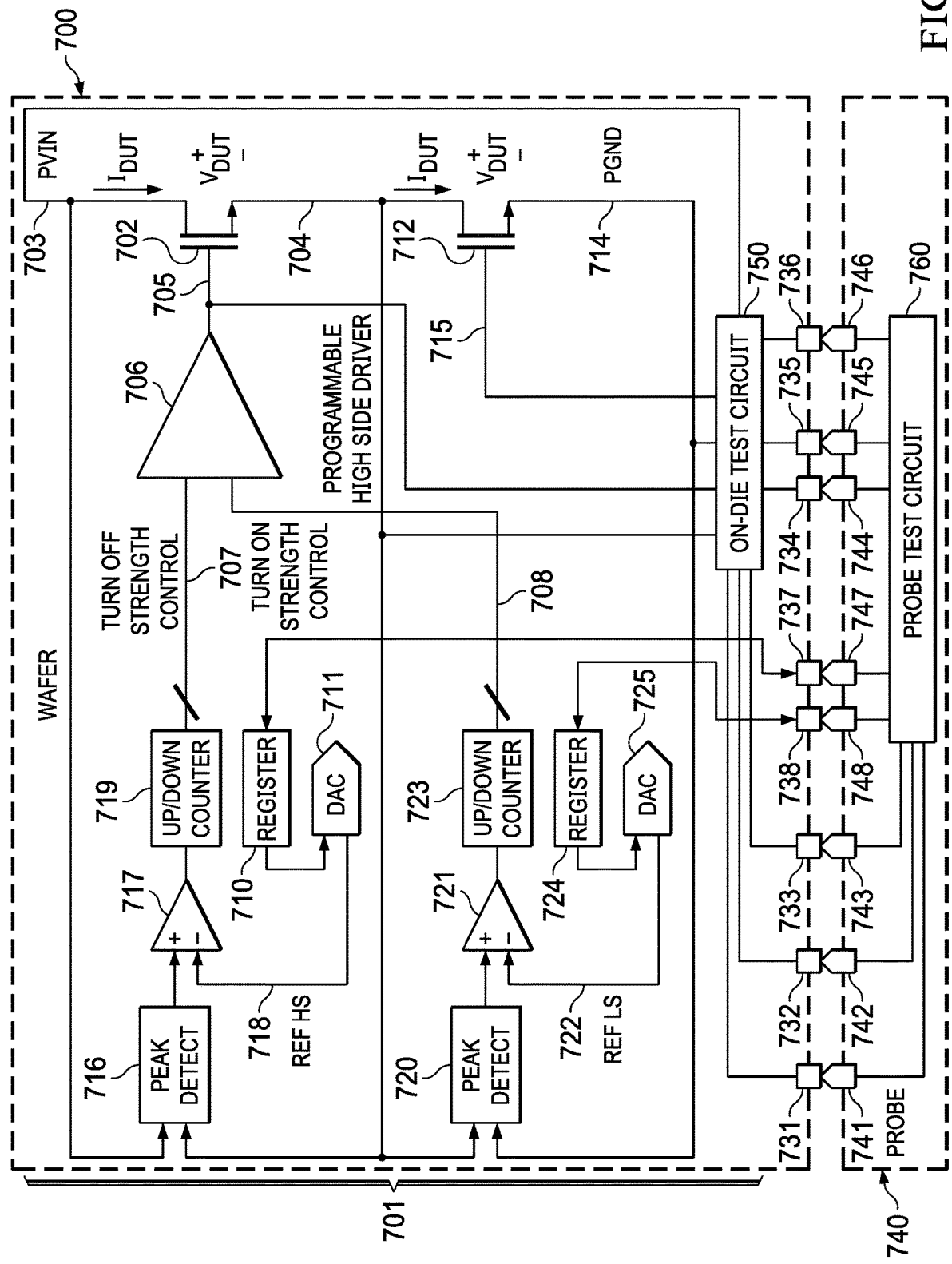
FIGS. 7 and 8 are schematic him diagram of a wafer probe engaging a first die location of another wafer with another embodiment of an on-die test circuit to test breakdown voltage of a transistor.
Figure 8:
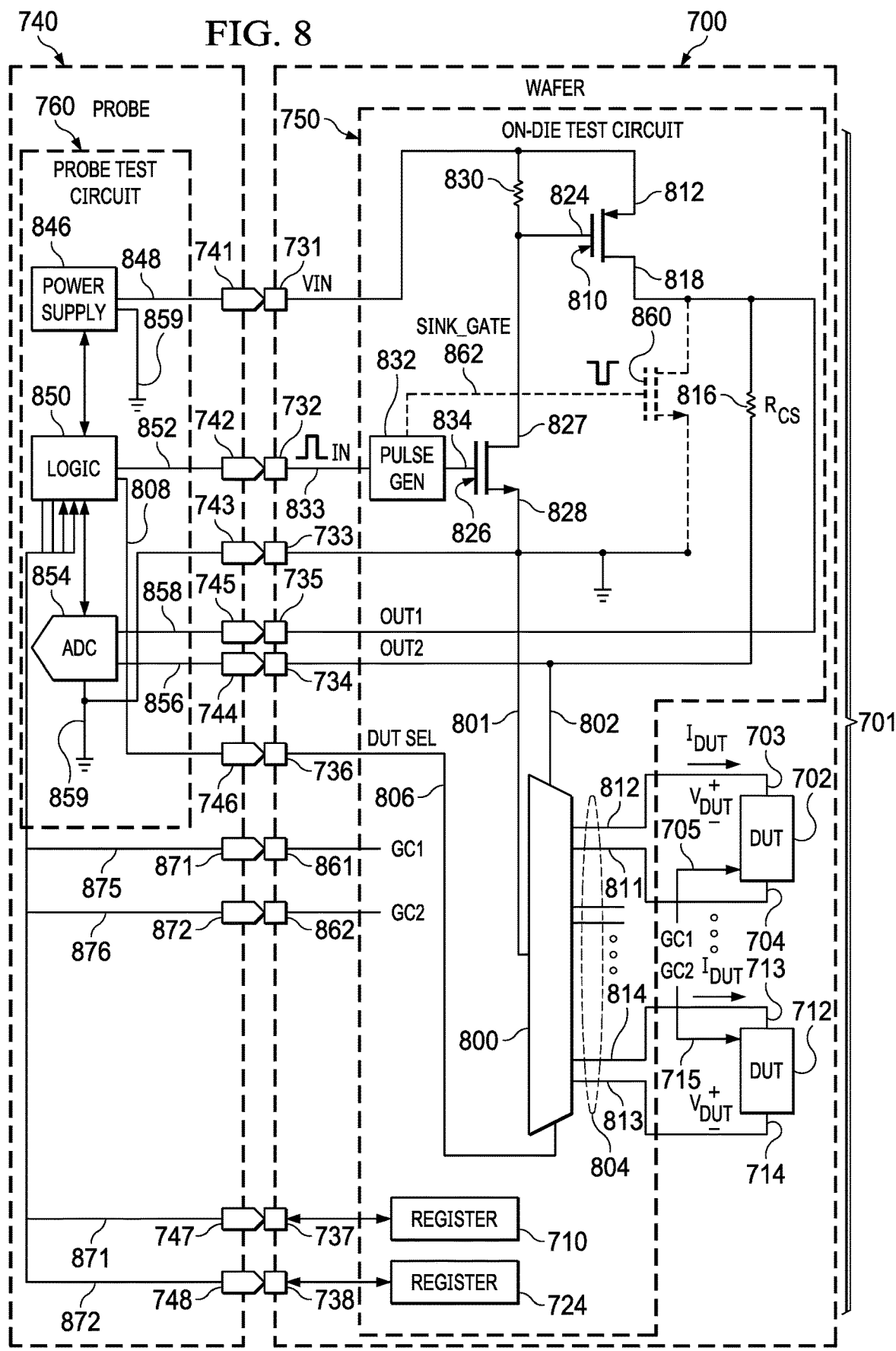

FIGS. 7 and 8 show another example wafer probe testing system with a wafer 700 having one or more die locations 701. FIG. 7 shows one example die location 701 with a buck converter that includes high and low transistors that are tested during wafer probe testing to characterize one or more operating parameters thereof, such as breakdown voltage values (e.g., at 310 in the method of FIG. 3). The die location circuitry in FIG. 7 includes a first transistor electronic component 702 that operates as a high side switch in a buck converter circuit. The first transistor 702 is an NMOS device with a first (e.g., drain) terminal 703, a second (e.g., source) terminal 704, and a gate control terminal 705. The gate control terminal 705 is coupled to an output of a programmable high side driver 706. The high side driver 706 has a multi-bit first input 707 to control turn off strength of the high side first transistor 702, and a multi-bit second input 708 to control turn on strength of the high side first transistor 702 during buck converter operation. A multi-bit first register 710 stores a first digital value. The first register 710 is coupled to provide the first digital value to a digital-to-analog converter (DAC) 711 to control a first reference voltage signal REF HS at an output of the DAC 711 for a high side driver control loop. The die location circuitry in FIG. 7 further includes a second transistor electronic component 712 that operates as a low side switch in the buck converter circuit. The second transistor 712 is an NMOS device with a first (e.g., drain) terminal coupled to the source terminal 704 of the first transistor 702, along with a second (e.g., source) terminal 714, and a gate control terminal 715.

The die location circuitry also includes a first peak detect circuit 716 with a first input coupled to the drain terminal 703 of the first transistor 702 to receive a power voltage input signal PVIN, and a second input coupled to the second (e.g., source) terminal 704 of the first transistor 702. The first peak detect circuit 716 has an output that provides a signal indicating a peak voltage across the first transistor 702. In the illustrated example buck converter configuration, the source terminal 704 of the first transistor 702 forms a switching node between the transistor 702 and 712, which is configured for coupling to an inductor (not shown) of a buck DC-DC converter circuit. The output of the first peak detect circuit 716 is coupled to a non-inverting input of a comparator 717. The comparator 717 has an inverting input 718 coupled to the output of the DAC 711 to receive the first reference voltage signal REF HS. The comparator 717 compares the output signal from the peak detector 716 with the first reference voltage signal REF HS. The comparator 717 has an output that provides a comparator output signal to an input of a first up/down counter 719. The first input 707 of the high side driver 706 is coupled to the first up/down counter 719 to control turn off strength of the high side first transistor 702, and a multi-bit second input 708 to control turn on strength of the high side first transistor 702 during buck converter operation. A multi-bit first register 710 stores a first digital value. The first register 710 is coupled to provide the first digital value to a digital-to-analog converter (DAC) 711 to control a first reference voltage signal REF HS at an output of the DAC 711 for a high side driver control loop.

The die location circuitry in FIG. 7 also includes a second peak detect circuit 720 with a first input coupled to the second (e.g., source) terminal 704 of the first transistor 702, and a second input coupled to the source terminal 712 of the second transistor 712, which has a power ground reference voltage PGND. The second peak detect circuit 720 has an output that provides a signal indicating a peak voltage across the second transistor 712. The output of the second peak detect circuit 720 is coupled to a non-inverting input of a second comparator 721. The second comparator 721 has an output that provides a comparator output signal to an input of a second up/down counter 723. A multi-bit second register 724 stores a second digital value. The second register 724 is coupled to provide the second digital value to a second DAC 725 to control a second reference voltage signal REF LS at an output of the second DAC 725 for a low side driver control loop. The second comparator 721 has an inverting input 722 coupled to the output of the second DAC 725 to receive the second reference voltage signal REF LS. The second comparator 721 compares the output signal from the second peak detector 720 with the second reference voltage signal REF LS. The second input 708 of the high side driver 706 is coupled to the multi-bit output of the second up/down counter 723 to control turn on strength of the high side first transistor 702 during buck converter operation.

The wafer location 701 in FIG. 7 includes conductive pads 731, 732, 733, 734, 735, 736, 737, and 738. A wafer probe 740 includes probe pins 741, 742, 743, 744, 745, 746, 747, and 748 arranged to selectively engage with the respective conductive pads 731, 732, 733, 734, 735, 736, 737, and 738 when the probe 740 engages the die location 701 of the wafer 700. The wafer location 701 in FIG. 7 includes an on-die test circuit 750, which is coupled to the conductive pads 731, 732, 733, 734, 735, and 736, and to the gate control terminals 705 and 715 of the respective first and second transistors 702 and 712, as well as to the source terminal (switching node) 704 of the first transistor 702. The wafer probe 740 in FIG. 7 includes a probe test circuit 760 that is coupled to FIG. 8 shows further details of the on-die test circuit 750 and the probe test circuit 760. The on-die test circuitry 750 in FIG. 8 includes devices, components, terminals, structures, nodes, features, regions, dimensions, and/or materials 800, 801, 802, 804, 806, 811, 812, 813 and 814 that generally correspond to the respective devices, components, terminals, structures, nodes, features, dimensions, and/or materials 200, 201, 202, 204, 206, 211, 212, 213 and 214 of the on-die test circuitry of FIG. 2 described above. As shown in FIG. 8, the first terminal 703 of the first transistor (DUT) 702 is coupled to the second multiplexer output 812 and the second terminal 704 of the first transistor 702 is coupled to the first multiplexer output 811. In addition, the third multiplexer output 813 is coupled to the source terminal 714 of the second transistor 712, and the fourth multiplexer output is coupled to the drain terminal (e.g., labeled 704) of the second transistor 712. This allows the selective coupling of one of the transistors 702, 712 to the remainder of the on-die test circuit 750 according to the multiplexer select signal DUT_SEL as discussed above in connection with FIG. 2.

The on-die test circuitry 750 in FIG. 8 also includes devices, components, terminals, structures, nodes, features, regions, dimensions, and/or materials 816, 818, 820, 822, 824, 826, 827, 828, 830, 832, 833, and 834 that generally correspond to the respective devices, components, terminals, structures, nodes, features, dimensions, and/or materials 106, 108, 110, 112, 114, 116, 117, 118, 120, 122, 123, and 124 of the on-die test circuitry described above in connection with FIGS. 1 and 2.

In addition, the probe test circuit 760 of FIG. 8 includes devices, components, terminals, structures, nodes, features, regions, dimensions, and/or materials 846, 848, 850, 852, 854, 856, 858, and 859 that generally correspond to the respective devices, components, terminals, structures, nodes, features, dimensions, and/or materials 146, 148, 150, 152, 154, 156, 158, and 159 of the wafer probe 140 of FIGS. 1 and 2 described above. The probe test circuit 760 operates generally as described above when the wafer probe 740 is engaged with the die location 701 of the wafer 700.

In one example, the wafer probe 740 is operated according to the method 300 of FIG. 3 above to selectively measure a breakdown voltage characteristic of one or both transistors 702 and 712. The logic circuit 850 provides the select signal DUT SEL to control the multiplexer 800 to selectively couple the drain and source of a selected one of the transistors 702, 712 to the conductive pads 734 and 735 for pulse testing through application of input signals IN to the pulse generator 832. In the illustrated example, the on-die test circuit 750 includes the third transistor 860, but this can be omitted in other implementations. In addition, the on-die test circuit 750 in FIG. 8 include circuit components like those of FIGS. 1 and 2. Another implementation instead uses the on-die test circuitry of FIG. 6 with an adjustable resistor 620 connected between the first transistor 610 and the current sense resistor 606 as previously described.

The logic circuit 850 in FIG. 8 has a control output coupled to the power supply 846 to control the amplitude of the input voltage signal VIN applied to the first conductive terminal 131 of the wafer die location 101. In one implementation, the logic circuit 850 is configured to implement a breakdown voltage test of the selected DUT transistor 702, 712. The logic circuit 850 controls the amplitude of the input voltage signal VIN and provides pulses of different magnitudes to the selected electronic component 702, 712 and uses the A/D converter 854 to obtain multiple sets of voltage and current measurements ($V_{DUT}$ and $I_{DUT}$) at corresponding VIN voltage levels. The logic circuit 850 determines a breakdown voltage of the elected transistor electronic component 702, 712 according to the measured DUT voltage and current values. In one implementation, the logic circuit 850 computes a desired value for one or both of the first reference voltage signal REF HS and/or the second reference voltage signal REF LS according to the breakdown voltage value and/or according to the voltage and current measurements ($V_{DUT}$ and $I_{DUT}$) and stores one or more corresponding values in the respective DAC register(s) 710 and 724 to provide a safe operating reference to be used in the final IC after fabrication and packaging are completed.

In one example, the wafer probe 740 includes first and second gate control probe pins 871 and 872, respectively coupled to first and second gate control outputs 875 and 876 of the logic circuit. The die location 701 of the wafer 700 includes corresponding first and second conductive pads 861 and 862 respectively coupled to the gate control terminals 705 and 715 of the corresponding first and second electronic components 702 and 712. In this example, the logic circuit 850 provides first and second gate control signals GC1 and GC2 at the respective gate control outputs 875 and 876 to control the on or off state of the respective electronic components 702 and 712 during testing. In one implementation, the logic circuit 850 provides the first and second gate control signals GC1 and GC to turn the selected electronic component 702, 712 off during breakdown voltage testing.

Figure 9:
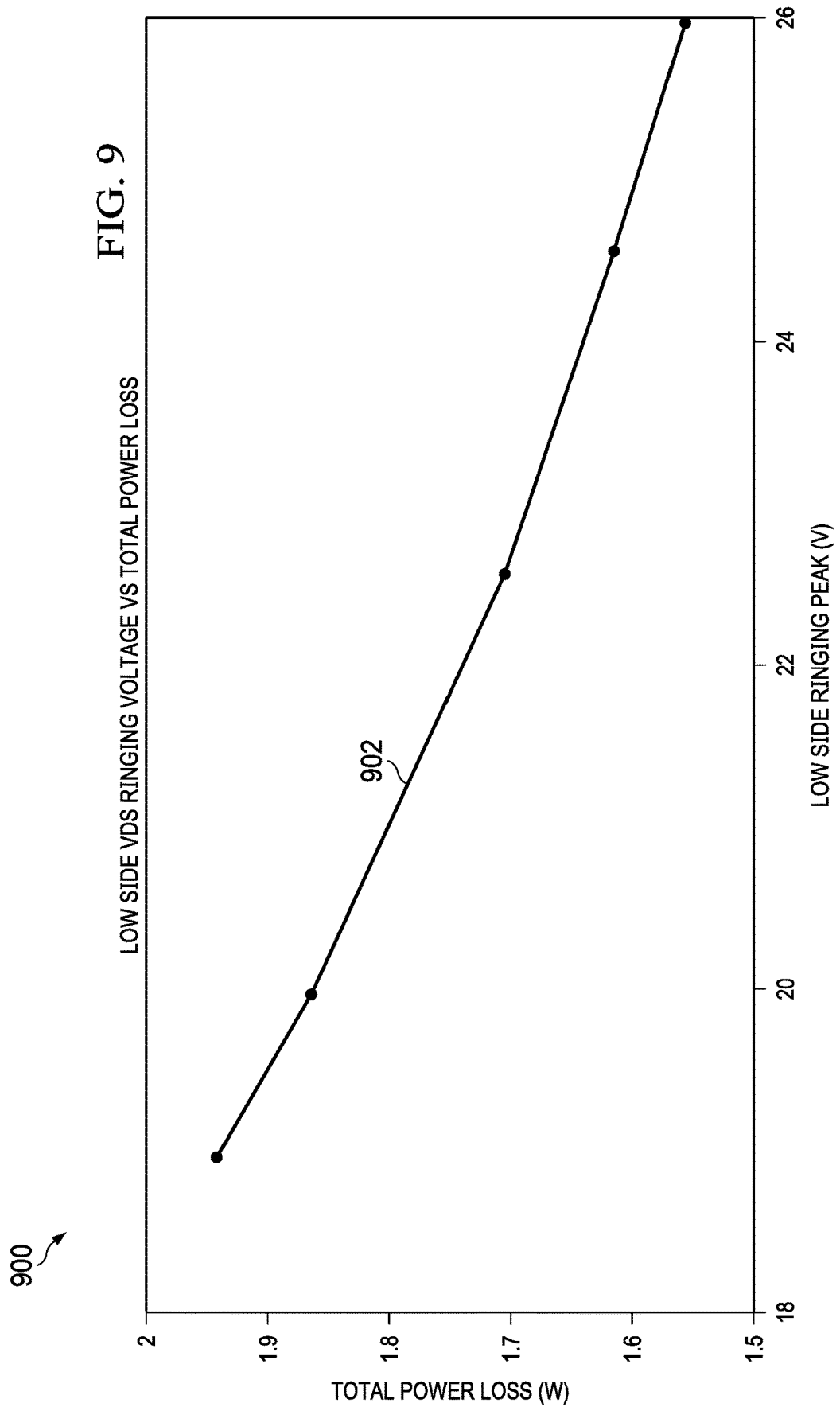
FIG. 9 is a signal diagram of a tested device power loss curve.

FIG. 9 shows a tested device power loss curve for a tested electronic component of a wafer die location. FIG. 9 shows a graph 900 with a curve 902 of device power loss as a function of low side ringing peak voltage obtained using the wafer probe 740 and on-die test circuitry 750 of FIGS. 7 and 8. Described on-die test circuits and wafer probes provide the ability to control current and/or duration of pulses; to perform repetitive strikes; test electronic components and different or varying temperature; to reduced parasitic effects during pulse testing; and the capability to perform leakage tests, VFTLP/TLP measurements for different DUTs to characterize SOA; RRSOA; ESD; and Avalanche of a tested device, as well as on-die breakdown voltage characterization, any or all of which are done at wafer probe test during semiconductor manufacturing, prior to die singulation and packaging.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An integrated circuit (IC), comprising:
   first through fifth conductive pads;
   an on-die testing circuit including:
      a resistor having first and second terminals, the first terminal coupled to the fourth conductive pad, the second terminal coupled to the fifth conductive pad;
      a first transistor having first and second terminals and a control terminal, the first terminal of the first transistor coupled to the first conductive pad, the second terminal of the first transistor coupled to the fifth conductive pad and to the second terminal of the resistor;
      a second transistor having first and second terminals and a control terminal, the first terminal of the second transistor coupled to the control terminal of the first transistor, the second terminal of the second transistor coupled to the third conductive pad; and
      a pulse generator having an input and an output, the input coupled to the second conductive pad, the output coupled to the control terminal of the second transistor, and
   an electronic component coupled to the on-die testing circuit.

2. The IC of claim 1,
   wherein the first transistor is a PMOS transistor having a source coupled to the first conductive pad, having a drain coupled to the fifth conductive pad, and having a gate;
   wherein the second transistor is an NMOS transistor having a drain coupled to the gate of the first transistor, having a source coupled to the third conductive pad, and having a gate coupled to the output of the pulse generator; and
   the IC comprising a second resistor having a first terminal coupled to the drain of the second transistor and to the gate of the first transistor, and having a second terminal coupled to the first conductive pad.

3. The IC of claim 2, wherein the electronic component is a first electronic component having respective first and second terminals, the IC further comprising:
   a sixth conductive pad;
   a multiplexer having:
      a first multiplexer input coupled to the fourth conductive pad,
      a second multiplexer input coupled to the third conductive pad,
      a first multiplexer output coupled to the first terminal of the first electronic component,
      a second multiplexer output coupled to the first terminal of the first electronic component,
      a third multiplexer output,
      a fourth multiplexer output, and
      a control input coupled to the sixth conductive pad; and
   a second electronic component having first and second terminals, the first terminal of the second electronic component coupled to the third multiplexer output, and the second terminal of the second electronic component coupled to the fourth multiplexer output.

4. The IC of claim 2, further comprising a third transistor having a first terminal coupled to the fifth conductive pad, having a second terminal coupled to the third conductive pad, and having a control terminal;
   wherein the pulse generator has a second output coupled to the control terminal of the third transistor.

5. The IC of claim 1, further comprising a third transistor having a first terminal coupled to the fifth conductive pad, having a second terminal coupled to the third conductive pad, and having a control terminal;
   wherein the pulse generator has a second output coupled to the control terminal of the third transistor.

6. The IC of claim 5, wherein the third transistor is an NMOS transistor having a drain coupled to the fifth conductive pad, having a source coupled to the third conductive pad, and having a gate coupled to the second output of the pulse generator.

7. The IC of claim 1,
   wherein the first transistor is an NMOS transistor having a drain coupled to the first conductive pad, having a source, and having a gate;
   wherein the second transistor is an NMOS transistor having a drain coupled to the fifth conductive pad, having a source coupled to the third conductive pad, and having a gate coupled to the output of the pulse generator; and
   the IC comprising a second resistor having a first terminal coupled to the source of the first transistor, and having a second terminal coupled to the fifth conductive pad.

8. The IC of claim 7, wherein the electronic component is a first electronic component having first and second terminals, the IC further comprising:
- a sixth conductive pad;
- a multiplexer having:
  - a first multiplexer input coupled to the fourth conductive pad,
  - a second multiplexer input coupled to the third conductive pad,
  - a first multiplexer output coupled to the first terminal of the first electronic component,
  - a second multiplexer output coupled to the second terminal of the first electronic component,
  - a third multiplexer output,
  - a fourth multiplexer output, and
  - a control input coupled to the sixth conductive pad; and
- a second electronic component having first and second terminals, the first terminal of the second electronic component coupled to the third multiplexer output, and the second terminal of the second electronic component coupled to the fourth multiplexer output.

9. The IC of claim 7, further comprising a third transistor having a first terminal coupled to the fifth conductive pad, having a second terminal coupled to the third conductive pad, and having a control terminal;
wherein the pulse generator has a second output coupled to the control terminal of the third transistor.

10. The IC of claim 1, wherein the electronic component is a first electronic component having first and second terminals, the IC further comprising:
- a sixth conductive pad;
- a multiplexer having:
  - a first multiplexer input coupled to the fourth conductive pad,
  - a second multiplexer input coupled to the third conductive pad,
  - a first multiplexer output coupled to the first terminal of the first electronic component,
  - a second multiplexer output coupled to the second terminal of the first electronic component,
  - a third multiplexer output,
  - a fourth multiplexer output, and
  - a control input coupled to the sixth conductive pad; and
- a second electronic component having first and second terminals, the first terminal of the second electronic component coupled to the third multiplexer output, and the second terminal of the second electronic component coupled to the fourth multiplexer output.

11. The IC of claim 1, wherein the electronic component has first and second terminals, the first terminal of the electronic componenet coupled to the first terminal of the resistor and to fourth conductive pad, the second terminal of the electronic component coupled to the second terminal of the second transistor and to the third conductive pad.

12. The IC of claim 1, wherein the resistor is a first resistor, the on-die testing circuit is a first on-die testing circuit, the pulse generator is a first pulse generator, and the electronic component is a first electronic component having first and second terminals, the first terminal of the first electronic component coupled to the first terminal of the resistor and to fourth conductive pad, the second terminal of the first electronic component coupled to the second terminal of the second transistor and to the third conductive pad, the IC further comprising:
- sixth through tenth conductive pads;
- a second on-die testing circuit including:
  - a second resistor having first and second terminals, the first terminal of the second resistor coupled to the ninth conductive pad, the second terminal of the second resistor coupled to the tenth conductive pad;
  - a third transistor having first and second terminals and a control terminal, the first terminal of the third transistor coupled to the sixth conductive pad, the second terminal of the third transistor coupled to the tenth conductive pad and to the second terminal of the second resistor;
  - a fourth transistor having first and second terminals and a control terminal, the first terminal of the fourth transistor coupled to the control terminal of the third transistor, the second terminal of the fourth transistor coupled to the eighth conductive pad; and
  - a second pulse generator having an input and an output, the input of the second pulse generator coupled to the seventh conductive pad, the output of the second pulse generator coupled to the control terminal of the fourth transistor; and
- a second electronic component having first and second terminals, the first terminal of the second electronic device coupled to the first terminal of the second resistor and to ninth conductive pad, the second terminal of the second electronic device coupled to the second terminal of the fourth transistor and to the eighth conductive pad.

13. A method, comprising:
- engaging probe pins of a probe with conductive pads of a die area of a wafer, the conductive pads coupled to an on-die testing circuit within the die area;
- using the probe, applying a signal from the probe to a pulse generator of the on-die testing circuit;
- using the probe, measuring a voltage and a current of a device under test (DUT) within the die area; and
- using the probe, determining an operating characteristic of the DUT according to a measured voltage and a measured current of the DUT.

14. The method of claim 13, wherein determining the operating characteristic of the DUT comprises determining a breakdown voltage of a transistor DUT.

15. The method of claim 14, further comprising:
- using the probe, storing a value in a register of the die area according to the breakdown voltage of the transistor DUT.

16. The method of claim 13, wherein determining the operating characteristic of the comprises determining a safe operating area (SOA) of a transistor DUT.

17. The method of claim 13, further comprising:
- disengaging the probe pins of the probe from the conductive pads of the die area of the wafer;
- engaging the probe pins of the probe with conductive pads of a second die area of the wafer;
- using the probe, applying a signal from the probe to a pulse generator of the second die area;
- using the probe, measuring a voltage and a current of a second DUT of the second die area; and
- using the probe, determining an operating characteristic of the second DUT according to a measured voltage and a measured current of the second DUT.

18. The method of claim 13, further comprising:

using the probe, applying a select signal to a multiplexer of the die area to select a second DUT for testing;

using the probe, applying a second signal from the probe to the pulse generator of the die area;

using the probe, measuring a voltage and a current of a DUT; and using the probe, determining an operating characteristic of the second DUT according to a measured voltage and a measured current of the DUT of the second die area.

19. The method of claim 18, further comprising:

disengaging the probe pins of the probe from the conductive pads of the die area of the wafer;

engaging the probe pins of the probe with conductive pads of a second die area of the wafer;

using the probe, applying a signal from the probe to a pulse generator of the second die area;

using the probe, measuring a voltage and a current of a DUT of the second die area; and using the probe, determining an operating characteristic of the second DUT according to a measured voltage and a measured current of the DUT of the second die area.

20. A wafer probe, comprising:

probe pins arranged to engage conductive pads of a die area of a wafer, including a first probe pin, a second probe pin, a third probe pin, a fourth probe pin, a fifth probe pin, a sixth probe pin, and a seventh probe pin;

a power supply having an output coupled to the first probe pin, and a reference terminal coupled to the third probe pin;

a logic circuit having a first output coupled to the second probe pin and having second and third outputs; and an analog-to-digital converter having a first input coupled to the fourth probe pin, and having a second input coupled to the fifth probe pin;

in which the sixth probe pin is coupled to the second output of the logic circuit, the sixth probe pin is arranged to engage a first conductive pad of the die area of the wafer; and in which the seventh probe pin is coupled to the third output of the logic circuit, the seventh probe pin is arranged to engage a second conductive pad of the fie area of the wafer.

21. A method, comprising:

engaging probe pins of a probe with conductive pads of a die area of a wafer, the conductive pads coupled to an on-die testing circuit within the die area;

using the probe, applying a signal from the probe to a pulse generator of the on-die testing circuit;

using the probe, measuring a voltage and a current of a device under test (DUT) within the die area;

using the probe, determining an operating characteristic of the DUT according to a measured voltage and a measured current of the DUT; and singulating the wafer into a plurality of dies.

\* \* \* \* \*